(12) United States Patent
Yoshihisa (10) Patent No.: US 6,984,868 B2
(45) Date of Patent: Jan. 10, 2006

(54) SEMICONDUCTOR DEVICE HAVING A STRUCTURE FOR ISOLATING ELEMENTS

(75) Inventor: Yasuki Yoshihisa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/908,611

(22) Filed: Jul. 20, 2001

(65) Prior Publication Data

US 2002/0096725 A1 Jul. 25, 2002

(30) Foreign Application Priority Data

Jan. 19, 2001 (JP) .............................. 2001-012305

(51) Int. Cl.
*H01L 29/00* (2006.01)
(52) U.S. Cl. ...................... 257/499; 257/500; 257/501; 257/506
(58) Field of Classification Search ........ 257/499–506, 257/514, 517, 516, 370, 378
See application file for complete search history.

(56) References Cited

U.S. PATENT DOCUMENTS

| | | | | |
|---|---|---|---|---|
| 4,631,570 A | * | 12/1986 | Birrittella et al. ............ | 357/349 |
| 4,985,745 A | * | 1/1991 | Kitahara et al. ............. | 257/506 |
| 5,045,904 A | * | 9/1991 | Kobayashi et al. ......... | 357/23.6 |
| 5,175,607 A | * | 12/1992 | Ikeda .......................... | 257/511 |
| 5,218,227 A | * | 6/1993 | Kinoshia et al. ............ | 257/565 |
| 5,282,018 A | * | 1/1994 | Hiraki et al. ................ | 257/296 |
| 5,481,126 A | * | 1/1996 | Subramanian et al. ....... | 257/273 |
| 5,525,824 A | * | 6/1996 | Himi et al. .................. | 257/370 |
| 5,665,615 A | * | 9/1997 | Anmo ......................... | 438/202 |
| 5,909,044 A | * | 6/1999 | Chakravarti et al. ......... | 257/301 |
| 5,939,755 A | * | 8/1999 | Takeuchi et al. ............. | 257/347 |
| 6,011,297 A | * | 1/2000 | Rynne ......................... | 257/526 |
| 6,051,868 A | * | 4/2000 | Watanabe et al. ............ | 257/503 |
| 6,600,199 B2 | * | 7/2003 | Voldman et al. ............. | 257/370 |
| 2003/0107103 A1 | * | 6/2003 | Iwata et al. .................. | 257/506 |
| 2004/0012068 A1 | * | 1/2004 | Iwata et al. .................. | 257/506 |

FOREIGN PATENT DOCUMENTS

JP 7-263539 10/1995

* cited by examiner

*Primary Examiner*—Jerome Jackson
*Assistant Examiner*—Jesse A. Fenty
(74) *Attorney, Agent, or Firm*—McDermott Will & Emery LLP (57) ABSTRACT

A semiconductor device is disclosed involving a semiconductor substrate which contains a buried layer of a predetermined conductivity type as well as trenches deep enough to penetrate through the buried layer for element isolation purposes. Each of the trenches is formed in a boundary area between two regions with a potential difference developing therebetween, and an open-potential area is formed along the trench in the boundary area. This structure prevents leaks from occurring in areas interposed typically between an NPN region and an NMOS region in a BiCMOS semiconductor device, or any other area between two regions subject to two different potential levels.

3 Claims, 10 Drawing Sheets

SEMICONDUCTOR DEVICE HAVING A STRUCTURE FOR ISOLATING ELEMENTS

BACKGROUND OF THE INVENTION

1. Field of the Invention

The present invention relates to a semiconductor device and a method for manufacturing that device. More particularly, the invention relates to a bipolar LSI and a BiCMOS (bipolar CMOS)-LSI having a structure for isolating elements by use of trenches.

2. Background Art

In recent years, the need for ever-faster processing prompted by improved driving capabilities of elements has led to widespread use of the BiCMOS-LSI wherein CMOS and bipolar transistors are formed on the same substrate.

Figure 15:
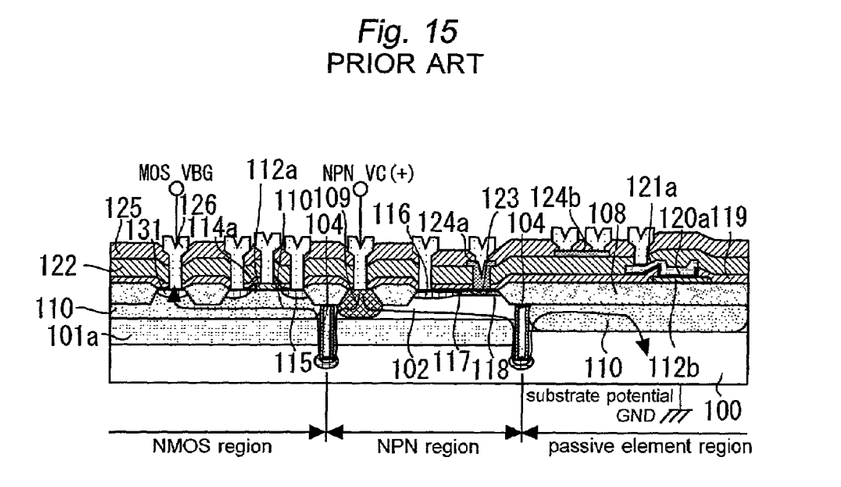
FIG. 15 is a schematic cross-sectional view of a conventional BiCMOS semiconductor device having developed leaks.

FIG. 15 is a schematic cross-sectional view of a typical BiCMOS-LSI whose elements are isolated by trenches and whose passive elements include poly-poly capacitors and polysilicon resistances.

The BiCMOS-LSI shown in FIG. 15 has a P-type silicon semiconductor substrate 100 comprising an N-type buried layer 101a that is penetrated by trenches 104 filled with a polycrystalline silicon film 107a each, the trenches 104 serving for element isolation. On the N-type buried layer 101a is formed a P-type tab region 110 where NMOS transistors are formed. Also on the N-type buried layer 101a is formed an N-type epitaxial layer 102 where NPN bipolar transistors are fabricated. Certain areas of an element isolating oxide film 108 include a poly-poly capacitor (lower electrode 112b, upper electrode 121a, capacity coupling film 120a) and a polysilicon resistance 124b as passive elements.

A region where the NPN bipolar transistors are formed (called the NPN region hereunder) comes adjacent to a passive element region where the poly-poly capacitor (lower electrode 112b, upper electrode 121a, capacity coupling film 120a) and the polysilicon resistance 124b are formed, with a trench 104 interposed between the two regions. Another region where the NMOS transistors are formed (called the NMOS region hereunder) is located adjacent to the NPN region, also with a trench 104 interposed therebetween.

As illustrated in FIG. 15, the BiCMOS-LSI and bipolar LSI have conventionally adopted the element isolation structure utilizing the trenches 104 for isolation purposes. Only the trenches 104 in element-furnished portions isolate one element from another and separate each element from regions where no element is formed.

In the BiCMOS-LSI and bipolar LSI outlined above, the N-type buried layer 101a is not formed in the passive element region comprising the poly-poly capacitor (lower electrode 112b, upper electrode 121a, capacity coupling film 120a) and the polysilicon resistance 124b. The absence of the buried layer 101a is intended to reduce any parasitic capacity that may occur in the substrate. In addition, the passive element region tends to be formed in areas including the P-type tab region 110. As a result, the passive element region has the same potential as the substrate and develops a difference in potential from NPN regions nearby. With the BiCMOS-LSI in particular, a potential difference occurs between the MOS region where MOS transistors are formed on the one hand, and the NPN region where bipolar transistors are furnished on the other hand. In many cases, a backgate contact region of each N-channel MOS transistor in the BiCMOS-LSI is located close to other active elements across trenches 104.

If a potential difference occurs between the passive element region and the NPN region isolated by the trench 104, or between the NPN region and the MOS region, then conductive films such as the polycrystalline silicon film 107a filling the trenches 104 will develop a potential due to capacity coupling. That in turn leads to leaks (indicated by arrows in FIG. 15) channeled through the bottoms of the trenches 104, reducing a collector-to-substrate dielectric strength in the NPN transistors.

Figure 14A:
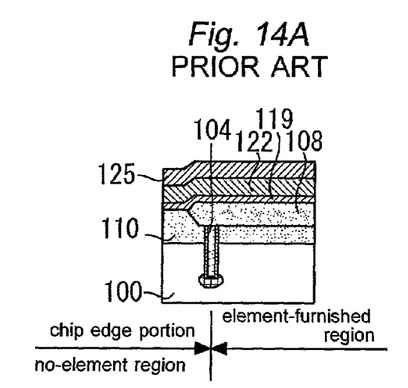
FIGS. 14A and 14B are schematic cross-sectional views of structures near chip edge portions of conventional BiCMOS semiconductor devices.
Figure 14B:
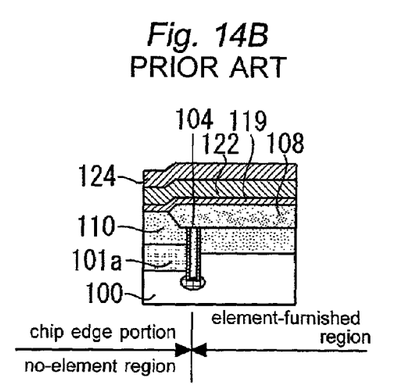

Furthermore, the trench-isolated structure in the bipolar LSI or BiCMOS-LSI is also subject to leaks if there is a potential difference between a no-element region in a chip edge portion and an element-furnished region. FIGS. 14A and 14B are schematic cross-sectional views of chip edge portions in the BiCMOS-LSI of FIG. 15. FIGS. 14A and 14B sketch chip edge portions fabricated by different methods.

As illustrated, the no-element region in the chip edge portion and the element-furnished region are located close to each other. If any no-element region develops a potential for some reason, there occurs a potential difference between the non-element region and the adjacent element-furnished region, which results in leaks.

SUMMARY OF THE INVENTION

It is therefore a first object of the present invention to overcome the above and other deficiencies of the related art and to provide a semiconductor device and a method for manufacturing that device wherein leaks attributable to a channel formed across the bottoms of isolation trenches are prevented between different regions.

It is a second object of the present invention to provide a semiconductor device and a method for manufacturing that device wherein leaks are forestalled between a region comprising passive elements such as resistors and capacitors on the one hand, and a region made of active elements on the other hand.

It is a third object of the present invention to provide a semiconductor device and a method for manufacturing that device wherein leaks are inhibited between elements bearing different potentials, particularly between a bipolar transistor and an MOS transistor in a BiCMOS-LSI.

It is a fourth object of the present invention to provide a semiconductor device and a method for manufacturing that device wherein leaks are suppressed between an element-furnished region on the one hand, and a no-element region such as a chip edge portion being subject to a potential for some reason on the other hand.

According to one aspect of the present invention, a semiconductor device comprises a semiconductor substrate which includes a buried layer of a predetermined conductivity type and trenches deep enough to penetrate the buried layer, wherein each of the trenches is formed in a boundary area between two regions differ in electric potential, and wherein an open-potential region is created along each of the trenches in the boundary area.

According to another aspect of the present invention, a method of manufacturing a semiconductor device comprises the following steps. Firstly an impurity diffusion layer is formed by implanting impurities into predetermined regions on a semiconductor substrate. Secondly an epitaxial growth layer is formed on the semiconductor substrate including the impurity diffusion layer, thus the impurity diffusion layer is rendered into a buried layer. Thirdly a trench penetrating the epitaxial growth layer and the buried layer underneath is formed so as to form an element isolation structure made of said trenches and of a open-potential region constituted.

According to the invention, a trench is formed in a boundary area between two regions with a potential difference developing therebetween, and an open-potential region is created along the trench in the boundary area. In this structure, an increase in potential of a polysilicon film filling the trenches, caused by a capacity coupling triggered by the potential difference between the regions, can be suppressed and thereby inhibits formation of a channel across the bottoms of the trenches intended for isolation. The structure makes it possible to keep the collector-to-substrate dielectric strength of bipolar transistors from getting reduced by leaks from the trenches bottoms.

Other and further objects, features and advantages of the invention will appear more fully from the following description.

DETAILED DESCRIPTION OF THE PREFERRED EMBODIMENTS

First Embodiment

What follows is a description of steps to manufacture a BiCMOS-LSI, a semiconductor device embodying this invention. The first embodiment of the invention will then be described by referring to FIGS. 8, 9A and 9B. FIGS. 1A through 7B, to be explained hereunder, illustrate processes for manufacturing the BiCMOS-LSI in carrying out the invention.

Figure 1A:
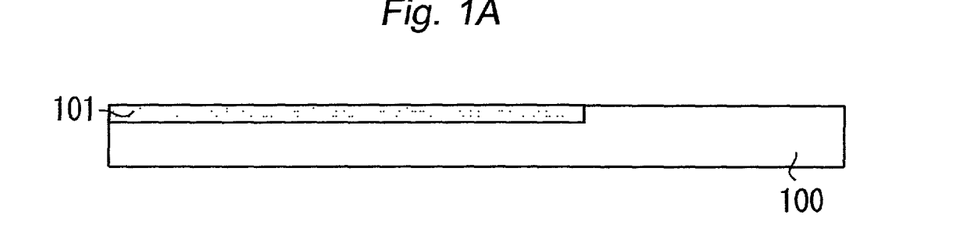
FIGS. 1A, 1B, 1C and 1D are schematic cross-sectional views of a BiCMOS semiconductor device as manufactured by different steps in carrying out this invention.
Figure 1B:
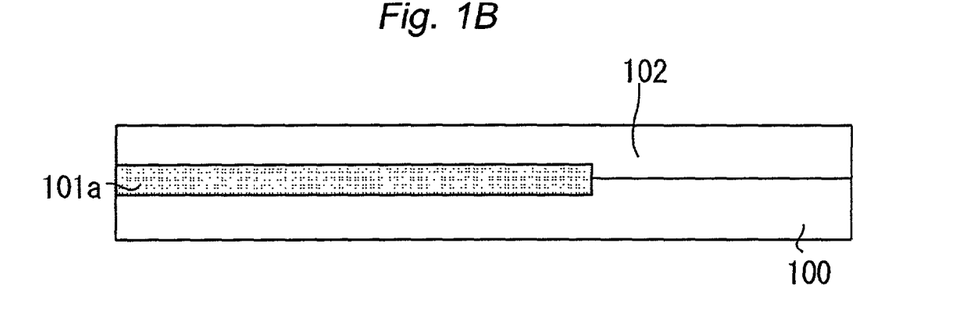
Figure 1C:
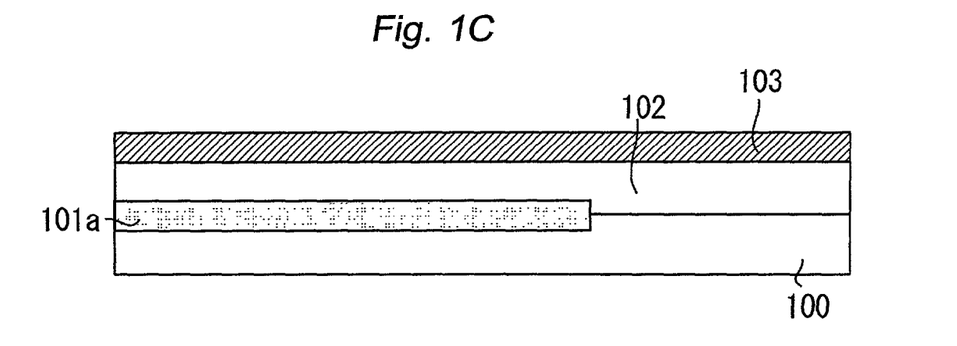

As shown in FIG. 1A, N-type impurities 101 are implanted into a suitable area on a P-type silicon semiconductor substrate 100. An N-type buried layer 101a is formed concurrently with an N-type epitaxial layer 102 through epitaxial growth as depicted in FIG. 1B. An oxide film 103 illustratively made of such as tetraethyl orthosilicate (TEOS) is then deposited on the surface of the N-type epitaxial layer 102 as shown in FIG. 1C.

Figure 1D:
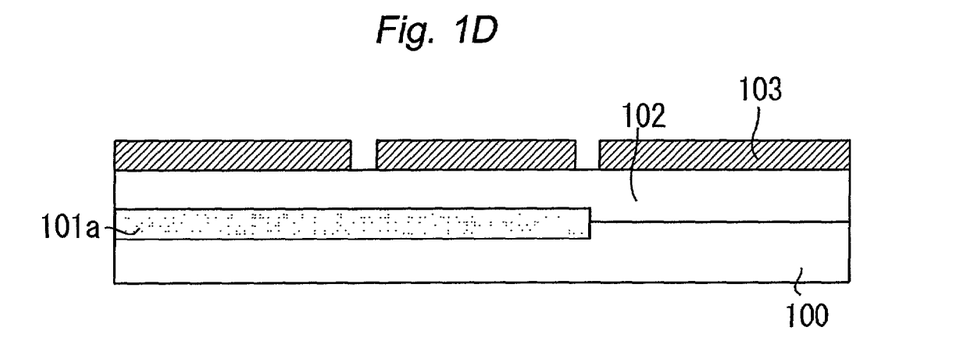
Figure 2A:
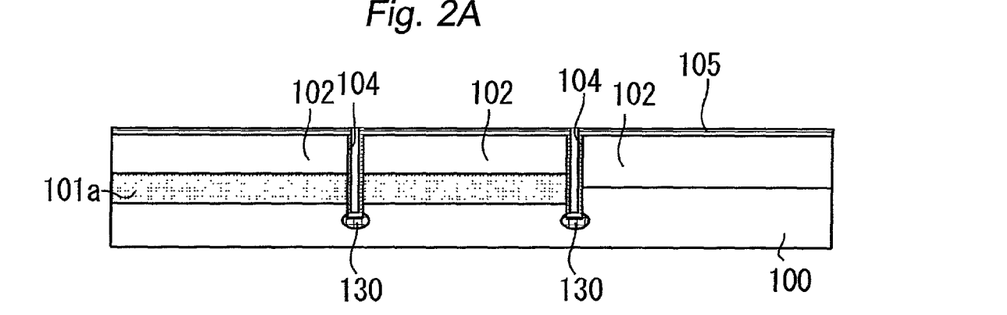
FIGS. 2A, 2B, 2C and 2D are more schematic cross-sectional views of the BiCMOS semiconductor continued from FIG. 1D.

Appropriate regions of the oxide film 103 are etched by photolithography and by ensuing dry-etching as depicted in FIG. 1D. With the oxide film 103 used as a mask, the N-type epitaxial layer 102 and the P-type silicon substrate 100 are etched to penetrate through the N-type buried layer 101a, thereby forming trenches 104 as shown in FIG. 2A.

After removal of the oxide film 103 that was used as the mask, a thermal oxide film 105 is formed by thermal oxidation in a manner covering both the surface of the N-type epitaxial layer 102 and the inside surface of the trenches 104. A resist pattern (not shown) covering regions other than the trenches 104 is then formed by photolithography. With the resist pattern used as a mask, P-type impurities such as boron (B) are implanted into the bottoms of the trenches 104. The thickness of the thermal oxide film 105 is determined in consideration of an Rp level in effect upon impurity implantation. These steps form an impurity diffusion layer 130 at the bottom of each trench 104.

Figure 2B:
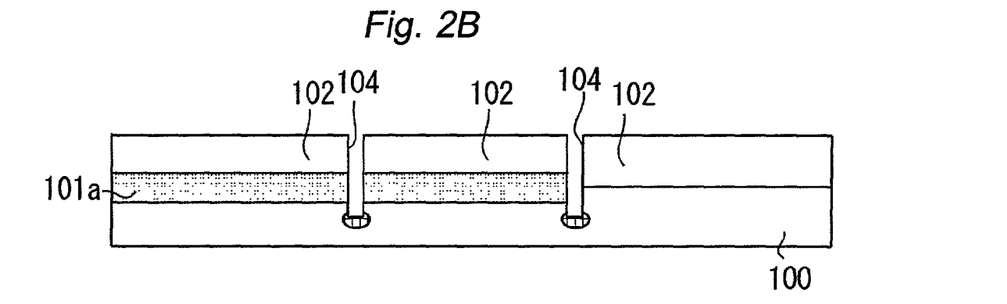
Figure 2C:
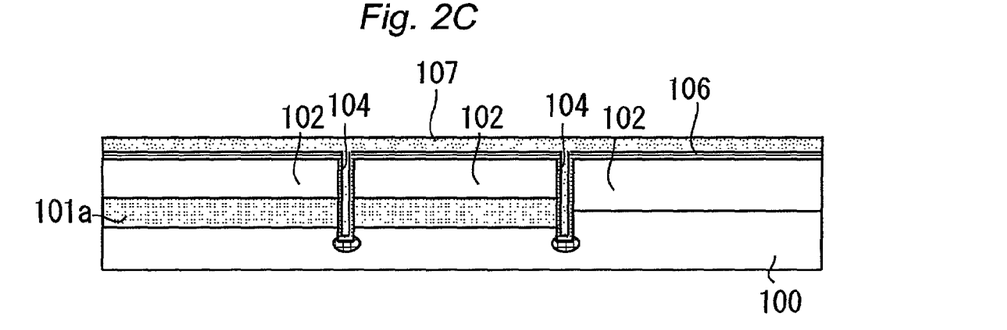
Figure 2D:
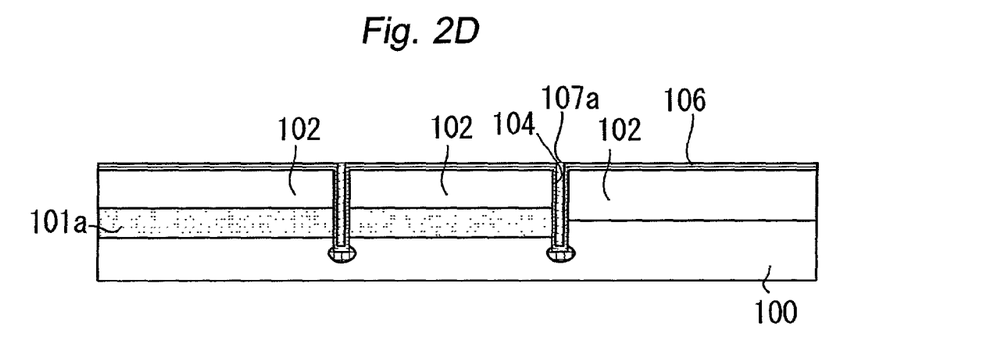

With the oxide film 105 removed illustratively by such as HF as shown in FIG. 2B, another thermal oxide film 106 is formed by thermal oxidation over the surface as depicted in FIG. 2C. The trenches 104 are filled with a suitable film having excellent buried characteristics such as a polycrystalline silicon (polysilicon) film 107. Thereafter, as shown in FIG. 2D, the polycrystalline silicon film 107 is removed except for inside the trenches 104. This leaves the trenches 104 filled with the polycrystalline silicon film 107a.

Figure 3A:
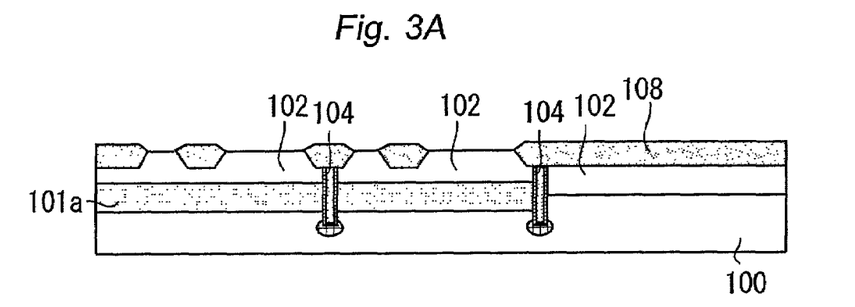
FIGS. 3A, 3B, 3C and 3D are more schematic cross-sectional views of the BiCMOS semiconductor continued from FIG. 2D.
Figure 3B:
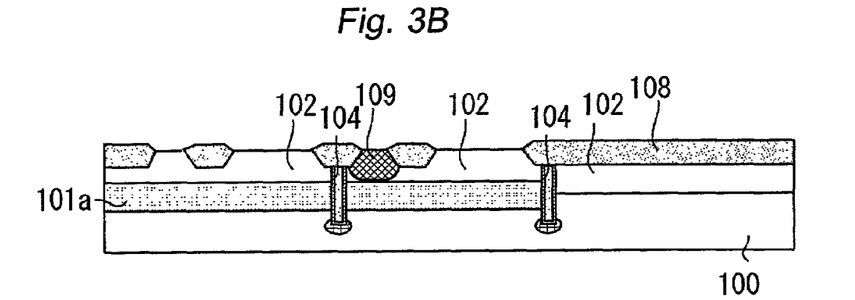

Over the trenches 104 and on other suitable regions, element isolating oxide film 108 are formed illustratively by LOCOS (localized oxidation of silicon) as indicated in FIG. 3A. With the oxide films 108 thus formed, a deep collector layer 109 is produced by depositing an appropriate substance such as phosphorus (P) on suitable locations in an NPN bipolar transistor-furnished region (called the NPN region hereunder) as shown in FIG. 3B.

Figure 3C:
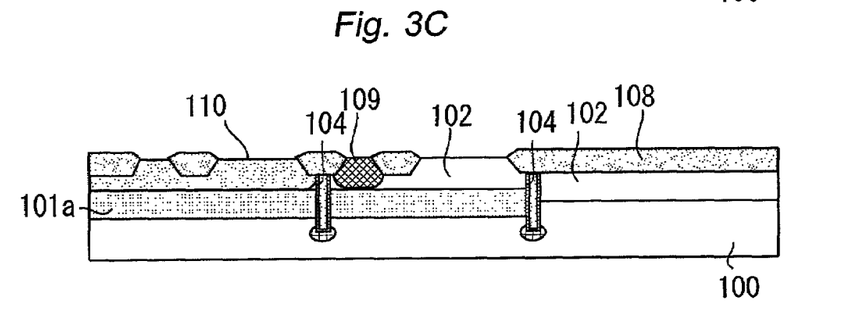

A P-type tab region 110 is then formed by implanting impurities such as boron (B) where required as indicated in FIG. 3C. Although not shown, an N-type tab region is produced by implanting impurities such as phosphorus (P) into other areas.

Figure 3D:
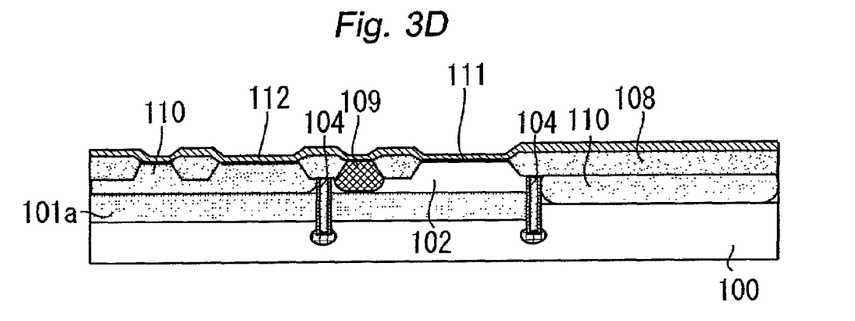
Figure 4A:
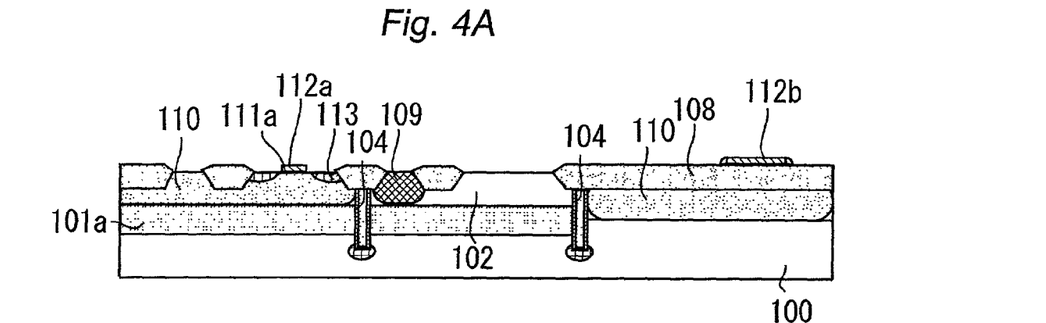
FIGS. 4A, 4B, 4C and 4D are further schematic cross-sectional views of the BiCMOS semiconductor continued from FIG. 3D.

A thermal oxide film 111 is formed by thermal oxidation over the active element region as depicted in FIG. 3D, followed by a polycrystalline silicon film 112 which is formed by doping with impurities and which serves as a gate electrode. As shown in FIG. 4A, the polycrystalline silicon film 112 and oxide film 111 are then patterned into gates by photolithography and by ensuing dry-etching, whereby a gate electrode 112a and a gate oxide film 111a of each MOS transistor are produced. At the same time, a lower electrode 112b constituting a poly-poly capacitor is formed on the element isolating oxide film 108.

Figure 4B:
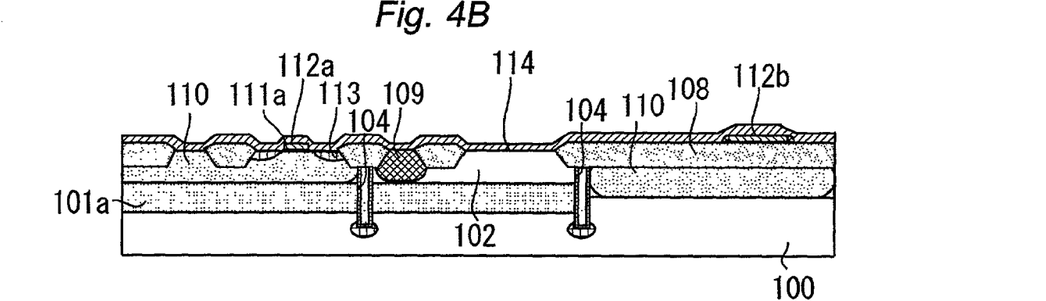
Figure 4C:
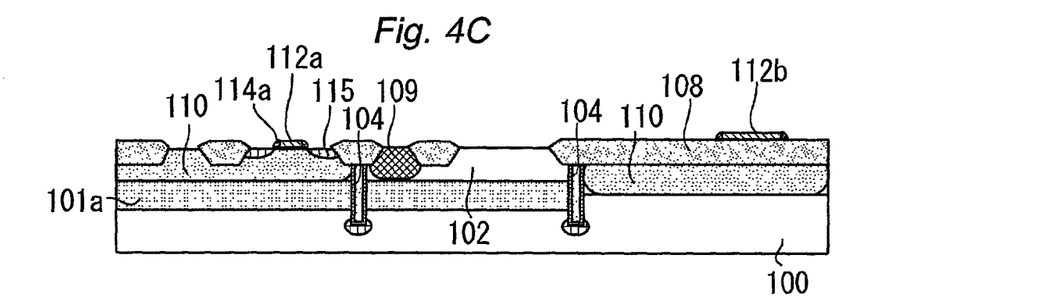

A resist pattern (not shown) covering areas other than the region where N-channel MOS transistors are formed (called the NMOS region hereunder) is then produced by photolithography. N-type impurities are implanted on both sides of the gate electrode 112a of the N-channel MOS transistor, whereby an N-type source/drain layer 113 is formed. An insulating film 114 such as TEOS is then deposited on the surface as shown in FIG. 4B. The insulating film 114 is formed by anisotropic etching into side walls 114a laterally covering the gate electrode 112a as indicated in FIG. 4C.

Thereafter, another resist pattern (not shown) is formed by photolithography so as to cover areas other than the NMOS region. N-type impurities are implanted into the NMOS region to produce an N+ source/drain layer 115. This turns the source/drain layer of the NMOS region into an LDD (Lightly Doped Drain) structure.

Figure 4D:
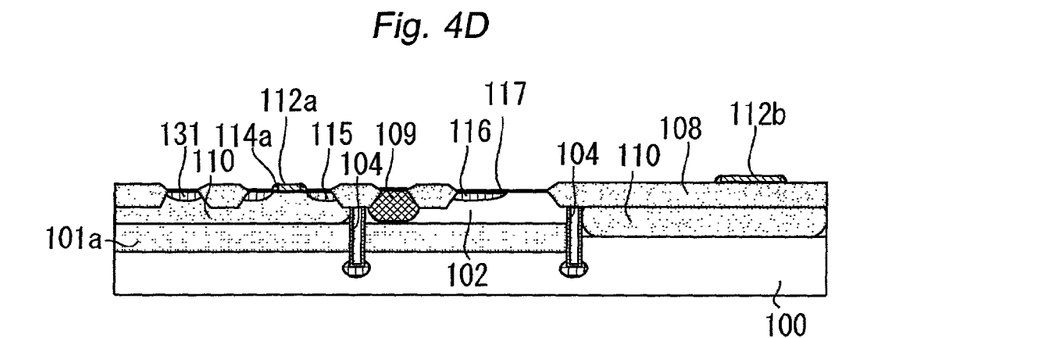

As shown in FIG. 4D, a resist pattern (not shown) covering areas other than the region constituting an NPN external base layer is then formed by photolithography. With the resist pattern used as a mask, P-type impurities are implanted so as to form an external base layer 116 of NPN bipolar transistors. At this point, a backgate contact region 131 of each N-channel MOS transistor and a source/drain layer of each P-channel MOS transistor, not shown, are formed concurrently.

Figure 5A:
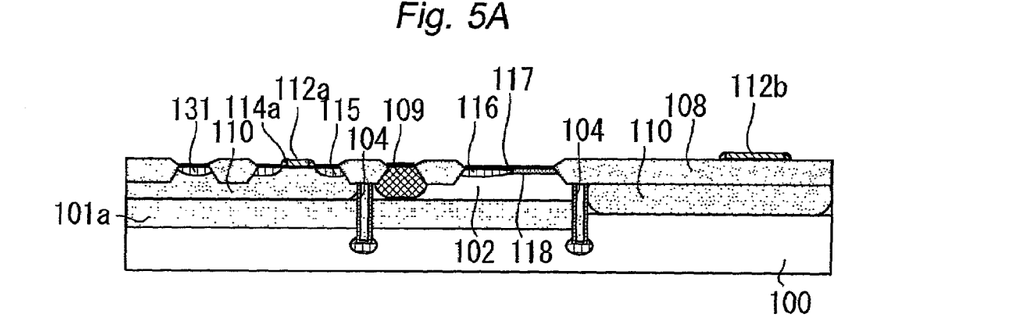
FIGS. 5A, 5B, 5C and 5D are further schematic cross-sectional views of the BiCMOS semiconductor continued from FIG. 4D.

As depicted in FIG. 5A, the source/drain layers 113 and 115 as well as the external base layer 116 are activated by thermal oxidation, whereby a thermal oxide film 117 is formed concurrently over each active element region. Thereafter, P-type impurities such as boron fluoride ($BF_2$) are implanted into an intrinsic base-furnished region of each NPN bipolar transistor to produce a base layer 118.

Figure 5B:
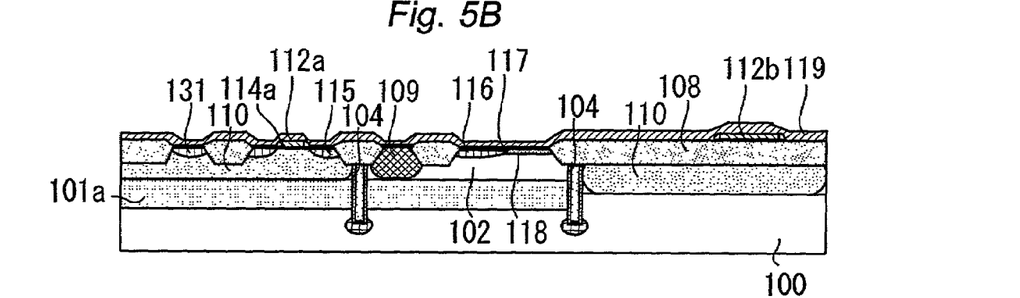

An insulating film 119 such as TEOS is then deposited all over the surface as shown in FIG. 5B.

Figure 5C:
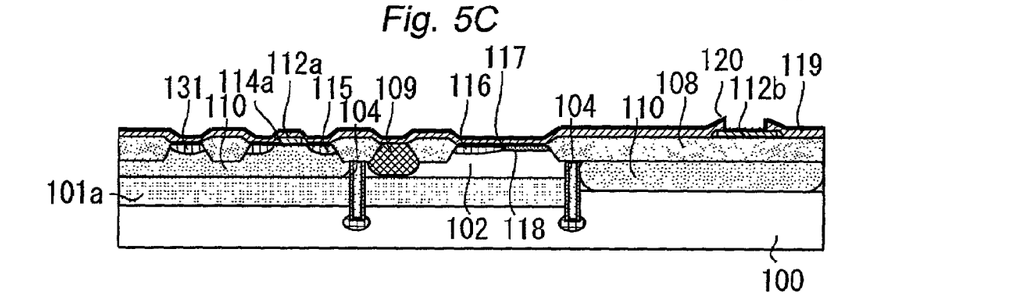
Figure 5D:
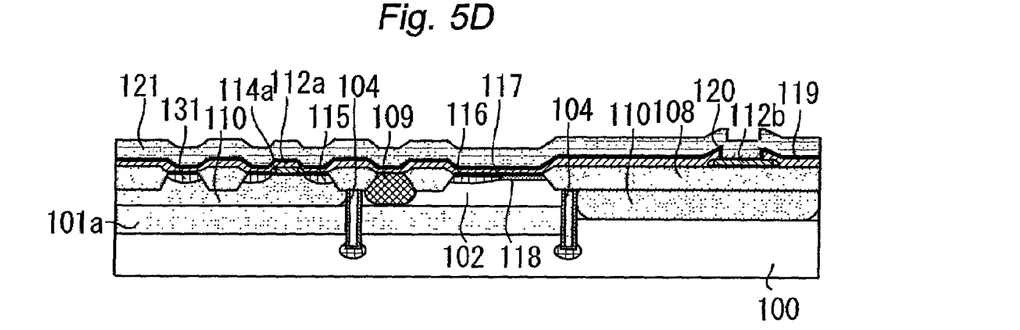

A resist pattern (not shown) is formed next by photolithography to cover regions other than the required locations on each lower electrode 112b constituting a poly-poly capacitor, as illustrated in FIG. 5C. With the resist pattern used as a mask, the insulating film 119 is removed from above the lower electrode 112b. After the mask-based removal of the insulating film 119, another insulating film 120 such as a silicon nitride film ($Si_3N_4$) is deposited onto the film 119, followed by formation of a conductive film 121 such as a doped polysilicon film as shown in FIG. 5D.

Figure 6A:
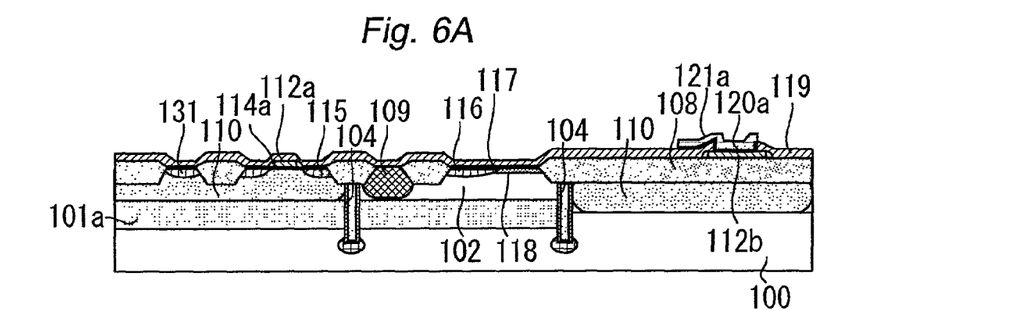
FIGS. 6A, 6B, 6C and 6D are further schematic cross-sectional views of the BiCMOS semiconductor continued from FIG. 5D.

A resist pattern (not shown) is then formed by photolithography to cover relevant regions on the conductive film 121. An upper electrode 121a of the poly-poly capacitor and a capacity coupling film 120a are formed by etching with this resist pattern used as a mask, as indicated in FIG. 6A. This process provides a poly-poly capacitor wherein the lower electrode 112b and the upper electrode 121a are combined with the capacity coupling film 120a interposed therebetween.

Figure 6B:
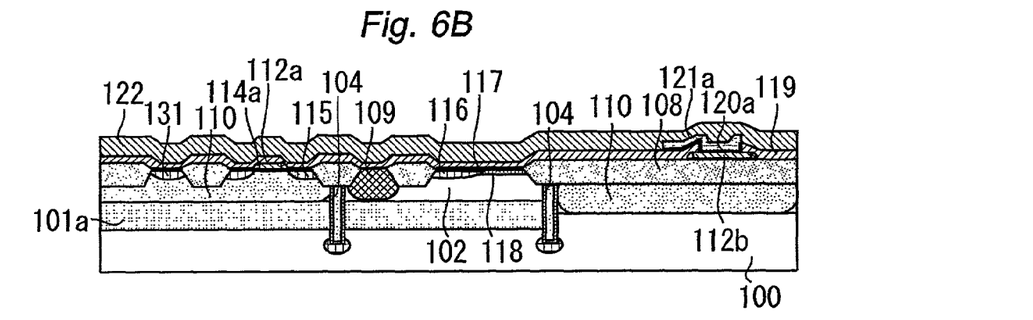
Figure 6C:
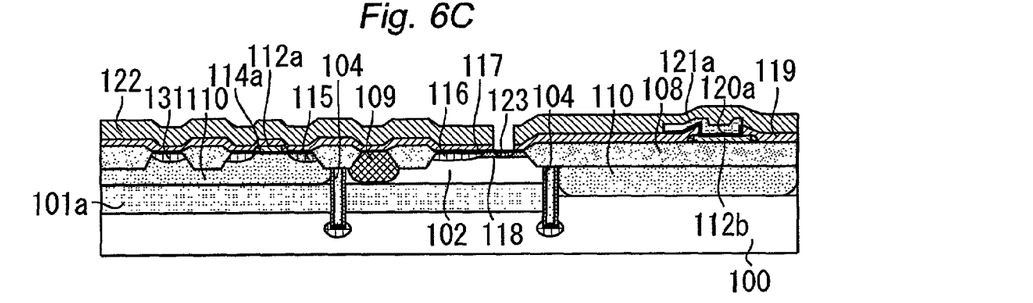

An insulating film 122 such as TEOS is then deposited as shown in FIG. 6B. The thermal oxide film 117 and the insulating film 119 and 122 are etched where required on the base layer 118 as depicted in FIG. 6C, whereby the base layer 118 is partially exposed. Thereafter, N-type impurities such as arsenic (As) are implanted to form an emitter layer 123 on the surface of the base layer 118.

Figure 6D:
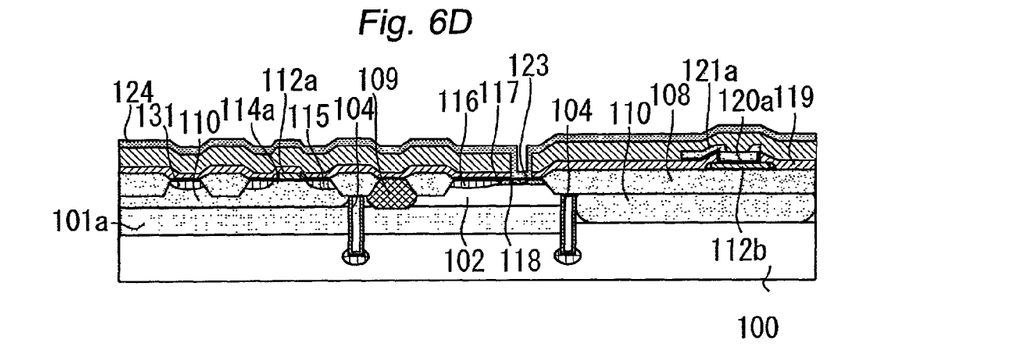
Figure 7A:
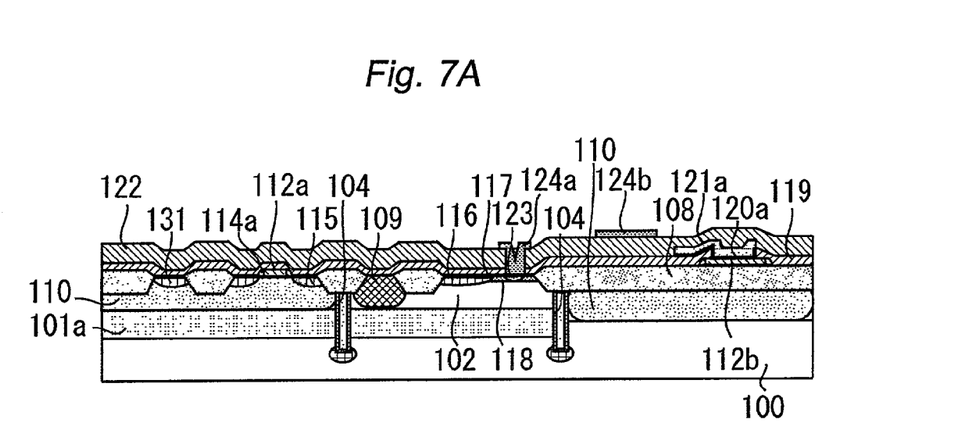
FIGS. 7A and 7B are further schematic cross-sectional views of the BICMOS semiconductor continued from FIG. 6D.
Figure 7B:
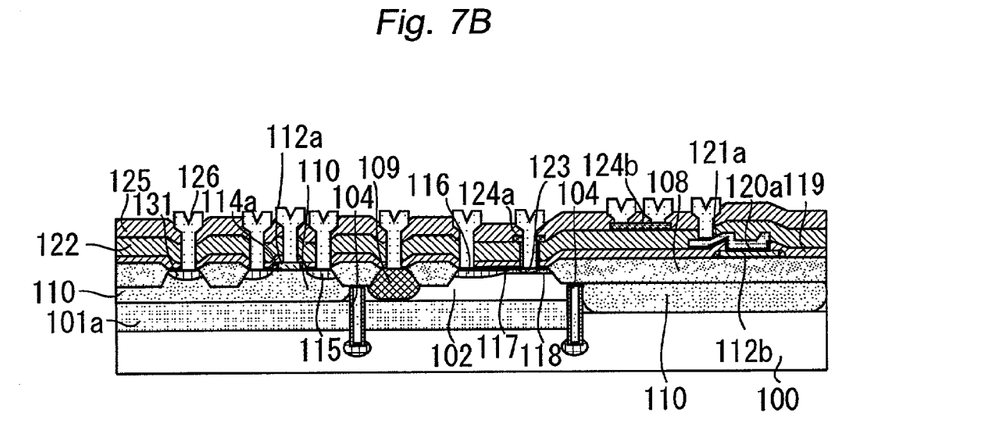

As shown in FIG. 6D, such as a polycrystalline silicon film 124 is then deposited and N-type impurities such as phosphorus are implanted into the polycrystalline film 124 to make it conductive. Following the impurity implantation, a resist pattern (not shown) covering regions except for the emitter layer 123 and the polysilicon resistance-furnished region is formed by photolithography. Etching is carried out using this resist pattern as a mask to produce an emitter electrode 124a and a polysilicon resistance 124b, as indicated in FIG. 7A.

A passivation film 125 is formed and thermally treated into having a plane surface, whereby the base layer 118 and the emitter layer 123 are activated. Then follow well-known wiring processes such as formation of contact holes and metal films for fabricating a wiring film 126. This completes a BiCMOS-LSI shown in FIG. 7B.

Figure 8:
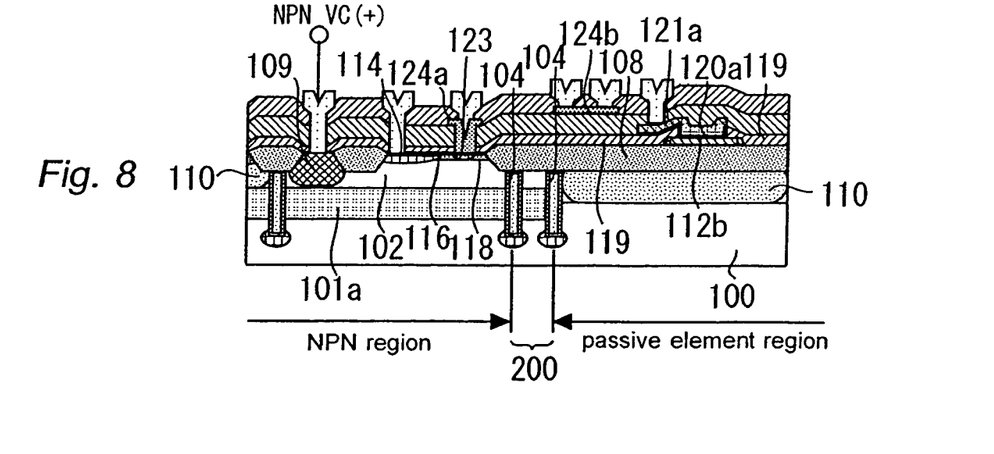
FIG. 8 is a schematic cross-sectional view of a semiconductor device practiced as a first embodiment of this invention.
Figure 9A:
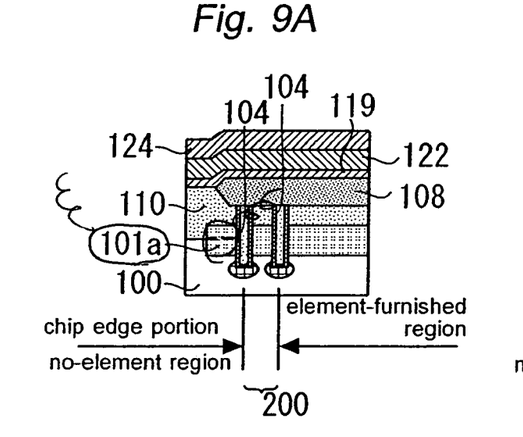
FIGS. 9A and 9B are schematic cross-sectional views of structures near chip edge portions of semiconductor devices practiced as the first and a second embodiment of this invention.
Figure 9B:
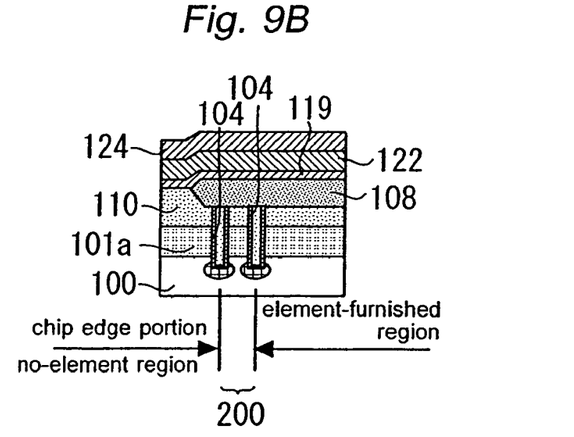

The first embodiment of this invention will now be described in detail. FIGS. 8, 9A and 9B are schematic cross-sectional views of a BiCMOS-LSI practiced as the first embodiment of the invention. Specifically, FIG. 8 shows a cross-section of a portion where an NPN region and a passive element region are located adjacent to each other. FIGS. 9A and 9B depict cross-sections of chip edge portions in the semiconductor device implemented as the first embodiment.

As shown in FIG. 8, where the NPN region is located adjacent to a poly-poly capacitor (lower electrode 112b, upper electrode 121a, capacity coupling film 120a) and a polysilicon resistance 124b as passive elements, trenches 104 are formed in pairs penetrating through the N-type buried layer 101a between the NPN region and the P-type tab region 110 immediately below the passive elements. The dual-trench structure separates the N-type buried layer 101a of the NPN region from the P-type tab region 110 of the passive element region, creating an open-potential region 200 between the two regions.

That is, paired trenches 104 are formed between the passive element region with no N-type buried layer 101a on the one hand and the NPN region on the other hand, with the open-potential region 200 created between the two trenches. This structure inhibits formation of a channel across the bottoms of the trenches 104 and thereby minimizes leaks even if a potential difference occurs between the NPN region including the N-type buried layer 101a on the one hand, and the passive element region having the same potential as the substrate on the other hand.

In the semiconductor device of the first embodiment, as shown in FIGS. 9A and 9B, the trenches 104 penetrating through the N-type buried layer 101a are also paired near the boundary between a no-element region in a chip edge portion and an element-furnished region. The dual-trench structure thus creates another open-potential region 200 between the no-element region and the element-furnished region. Differences between the structures in FIGS. 9A and 9B are attributable to different fabrication methods. More specifically, FIG. 9A shows a cross-section near the boundary between an element-furnished region such as the NMOS region on the one hand, and a no-element region having no N-type buried layer 101a in the chip edge portion on the other hand. FIG. 9B depicts a cross-section near the boundary between an element-furnished region and a no-element region in the chip edge portion, with an N-type buried layer 101a formed continuously between the two regions.

The open-potential region 200 created between the no-element region in the chip edge portion and the element-furnished region minimizes leaks from the chip edge. That is because the region 200 inhibits formation of a channel across the bottoms of the trenches 104 even if there occurs a potential difference between the element-furnished region and the no-element region being subject to a potential for some reason. Where the buried layer 101a is formed in the no-element region, as shown in FIG. 9B, leaks are minimized between the element-furnished region and the no-element region in the chip edge portion being affected by a potential for some reason.

Steps to manufacture the semiconductor device of the first embodiment are described below. Major steps constituting the method for manufacturing the first embodiment are substantially the same as those shown in FIGS. 1A through 7B. The description that follows will focus on some notably different steps.

With the first embodiment, the oxide film 103 is etched so as to form paired trenches 104 at the boundary between the NPN region and the passive element region in the step shown in FIG. 1D. In the chip edge portion, the oxide film 103 is likewise etched to create paired trenches 104. In the step sketched in FIG. 2A, the trenches 104 are formed in pairs to penetrate through the N-type buried layer 101a.

The subsequent steps are the same as those in FIGS. 1C through 7B. These steps combine to create a semiconductor device wherein an open-potential region 200 is formed at the boundary between the NPN region and the passive element region as well as between the element-furnished region and the no-element region, as shown in FIGS. 8, 9A and 9B.

With the first embodiment, as described, the paired trenches 104 formed between the NPN region and the passive element region as well as between the element-furnished region and the no-element region provide an open-potential region 200 between the two trenches. If a potential difference occurs between the NPN region and the passive element region or between the element-furnished region and the no-element region, any increase in potential of the polycrystalline silicon film 107a that fills the inside of the trenches 104, caused by a capacity coupling triggered by the potential difference, can be suppressed. This prevents formation of a channel across the bottoms of the trenches 104. With leaks thus stopped from the bottoms of the trenches 104, it is possible to keep the collector-to-substrate dielectric strength of the bipolar transistor from getting reduced thereby.

Second Embodiment

Another semiconductor device practiced as the second embodiment of this invention will now be described with reference to FIGS. 9A, 9B and 10.

Figure 10:
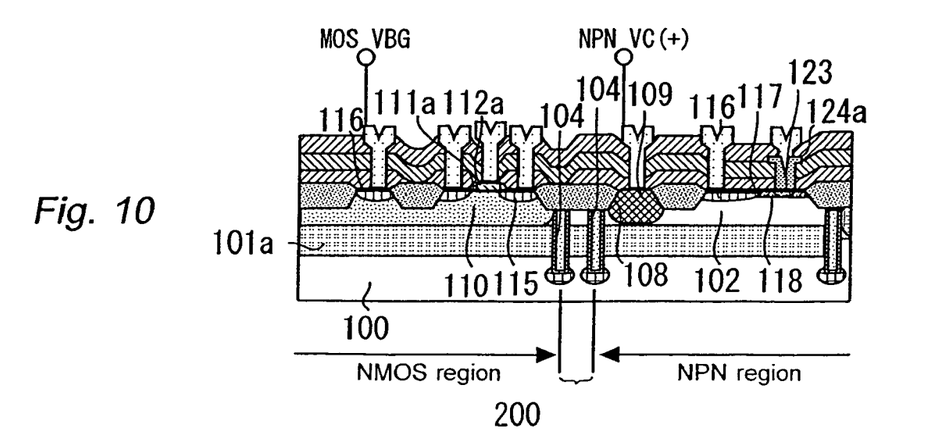
FIG. 10 is a schematic cross-sectional view of the semiconductor device as the second embodiment.

FIGS. 9A, 9B and 10 are schematic cross-sectional views of a BiCMOS-LSI, i.e., the semiconductor device of the second embodiment. FIG. 10 illustrates a cross-sectional structure of an NPN region and an NMOS region in the second embodiment. FIGS. 9A and 9B indicates a cross-section of the chip edge portion in the semiconductor device of the second embodiment.

With the second embodiment, as shown in FIG. 10, paired trenches 104 are formed in a boundary area where an NPN region and an NMOS region are located adjacent to each other. The dual-trench structure separates an N-type epitaxial layer 102 and a deep collector layer 109 in the NPN region from a P-type tab region 110 in the NMOS region, creating an open-potential region 200 between the two regions.

The open-potential region 200 suppresses formation of a channel across the bottoms of the trenches 104 even if a potential difference occurs between the NPN region (applied voltage: VC(+)) and the NMOS region (applied voltage: VBG), whereby leaks are minimized.

In the semiconductor device of the second embodiment, as shown in FIGS. 9A and 9B, trenches 104 are formed in pairs near the boundary between a no-element region in the chip edge portion and an element-furnished region. This structure also creates an open-potential region 200 between the no-element region and the element-furnished region.

The open-potential region 200 thus created inhibits formation of a channel across the bottoms of the trenches 104 even if a potential difference develops between the active element region on the one hand, and the chip edge portion being subjected to a potential for some reason on the other hand. The absence of the channel minimizes leaks.

Steps to manufacture the semiconductor device of the second embodiment are described below. Major steps constituting the method for manufacturing the second embodiment are substantially the same as those shown in FIGS. 1A through 7B. The description that follows will focus on appreciably different steps.

With the second embodiment, the oxide film 103 is etched so as to form paired trenches 104 at the boundary between an NPN bipolar transistor and an N-channel MOS transistor in the step shown in FIG. 1D. In the chip edge portion, the oxide film 103 is likewise etched to create paired trenches 104. In the step sketched in FIG. 2A, the trenches 104 are formed in pairs to penetrate through the N-type buried layer 101a.

The subsequent steps are the same as those in FIGS. 1C through 7B. These steps combine to create a semiconductor device wherein an open-potential region 200 is formed at the boundary between the NPN region and the NMOS region as well as between the no-element region in the chip edge portion and the element-furnished region, as shown in FIGS. 9A, 9B and 10.

With the second embodiment, as described, the paired trenches 104 formed between the NPN region and the NMOS region as well as between the no-element region in the chip edge portion and the element-furnished region provide an open-potential region 200 between the two trenches. If a potential difference occurs between the NPN region and the NMOS region or between the no-element region and the element-furnished region, any increase in potential of the polycrystalline silicon film 107a that fills the inside of the trenches 104, caused by a capacity coupling triggered by the potential difference, can be suppressed. This prevents formation of a channel across the bottoms of the trenches 104. With leaks thus stopped from the bottoms of the trenches 104, it is possible to keep the collector-to-substrate dielectric strength of the bipolar transistor from getting reduced thereby.

Third Embodiment

Another semiconductor device practiced as the third embodiment of this invention will now be described with reference to FIGS. 11, 12A and 12B.

Figure 11:
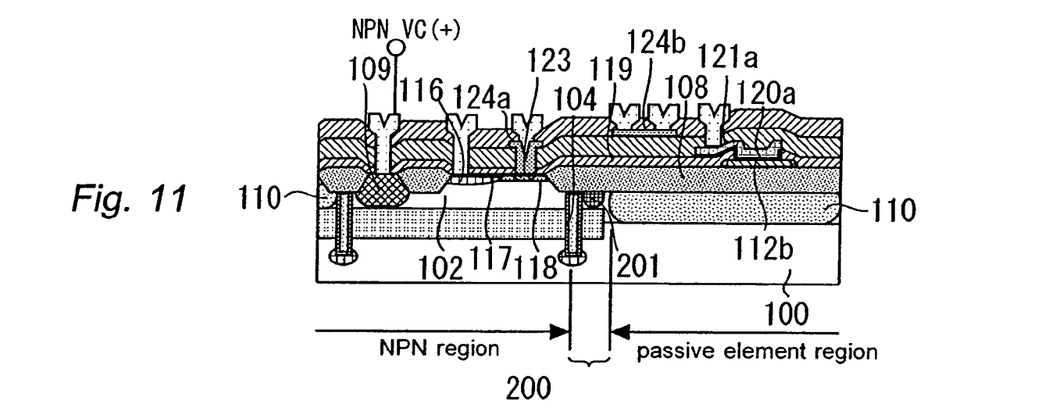
FIG. 11 is a schematic cross-sectional view of a semiconductor device practiced as a third embodiment of this invention.
Figure 12A:
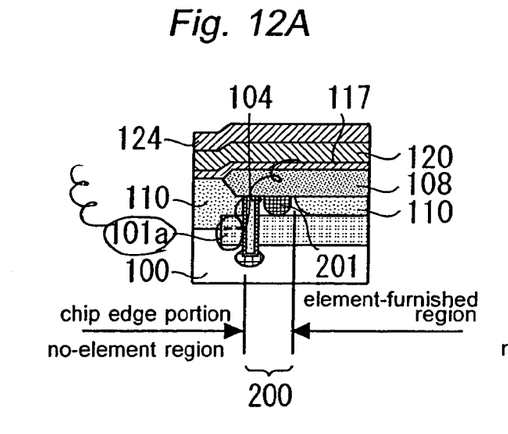
FIGS. 12A and 12B are schematic cross-sectional views of structures near chip edge portions of semiconductor devices practiced as the third and a fourth embodiment of this invention.
Figure 12B:
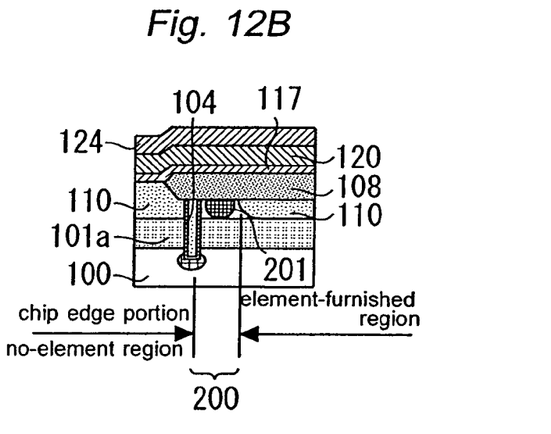

FIGS. 11, 12A and 12B are schematic cross-sectional views of another BiCMOS-LSI, i.e., the semiconductor device of the third embodiment. FIG. 11 shows a cross-sectional structure of an area where an NPN region and a passive element region are located adjacent to each other in the third embodiment. FIGS. 12A and 12B illustrates a cross-section of the chip edge portion in the semiconductor device of the third embodiment.

As shown in FIG. 11, in the third embodiment, where the NPN region is located adjacent to a poly-poly capacitor (lower electrode 112b, upper electrode 121a, capacity coupling film 120a) and a polysilicon resistance 124b as passive elements, an N-type tab region 201 is formed close to the trenches 104. This structure electrically isolates the NPN region from the passive element region.

Forming the N-type tab region 201 separates the trenches 104 from a P-type tab region 110, which creates an open-potential region 200 between the NPN region and the passive element region. This structure minimizes leaks by inhibiting formation of a channel across the bottoms of the trenches 104 if a potential difference occurs between the NPN region and the passive element region.

In the semiconductor device of the third embodiment, as shown in FIGS. 12A and 12B, the trenches 104 are formed near the boundary between the no-element region in the chip edge portion and the element-furnished region. The N-type tab region 201 is provided in the proximity of the trenches 104. This structure electrically isolates the no-element region from the element-furnished region. Differences between the structures in FIGS. 12A and 12B are attributable to different fabrication methods. More specifically, FIG. 12A shows a cross-section of a no-element region having no N-type buried layer 101a. FIG. 12B depicts a cross-section with an N-type buried layer 101a formed continuously between the element-furnished region and the no-element region in the chip edge portion.

The N-type tab region 201 formed between the no-element region and the element-furnished region provides electrical isolation therebetween. With the trenches 104 separated from the P-type tab region 110, an open-potential region 200 is created between the no-element region and the element-furnished region. This structure minimizes leaks by suppressing formation of a channel across the bottoms of the trenches 104 if a potential difference develops between the element-furnished region on the one hand and the no-element region being subject to a potential for some reason on the other hand. As illustrated in FIG. 12B, the buried layer 101a formed in the no-element region minimizes leaks between the element-furnished region and the no-element region in the chip edge portion being affected by a potential.

Steps to manufacture the semiconductor device of the third embodiment are described below. Major steps constituting the method for manufacturing the third embodiment are substantially the same as those shown in FIGS. 1A through 7B. The description that follows will focus on some significantly different steps.

In the third embodiment, the N-type tab region 201 is formed near the trenches 104 at the boundary between the NPN region and the passive element region prior to the formation of the element isolating oxide film 108 shown in FIG. 3A. The N-type tab region 201 is likewise formed in the chip edge portion. For tab region formation, a resist pattern covering areas other than the N-type tab region 201 is first formed by photolithography. With the resist pattern used as a mask, N-type impurities such as phosphorus are then implanted so as to form an impurity diffusion layer that will constitute the N-type tab region 201.

The subsequent steps are the same as those in FIGS. 3A through 7B. These steps combine to create a semiconductor device in which the N-type tab region 201 is formed near the trench 104 at the boundary between the NPN region and the passive element region as well as between the no-element region in the chip edge portion and the element-furnished region, whereby the open-potential region 200 is created as shown in FIGS. 11, 12A and 12B.

In the third embodiment, as described, the trenches 104 are formed at the boundary between the NPN region and the passive element region as well as between the no-element region in the chip edge portion and the element-furnished region. The N-type tab region 201 formed in the proximity of the trenches 104 provides a PN isolation structure giving rise to an open-potential region 200, whereby the regions involved are electrically separated from one another. If a potential difference occurs between the NPN region and the passive element region or between the chip edge portion and the active element region, any increase in potential of the polycrystalline silicon film 107a that fills the inside of the trenches 104, caused by a capacity coupling triggered by the potential difference, can be suppressed. This prevents formation of a channel across the bottoms of the trenches 104. With leaks thus stopped from the bottoms of the trenches 104, it is possible to keep the collector-to-substrate dielectric strength of the bipolar transistor from getting reduced thereby.

Fourth Embodiment

Another semiconductor device practiced as the fourth embodiment of this invention will now be described with reference to FIGS. 12A, 12B and 13.

Figure 13:
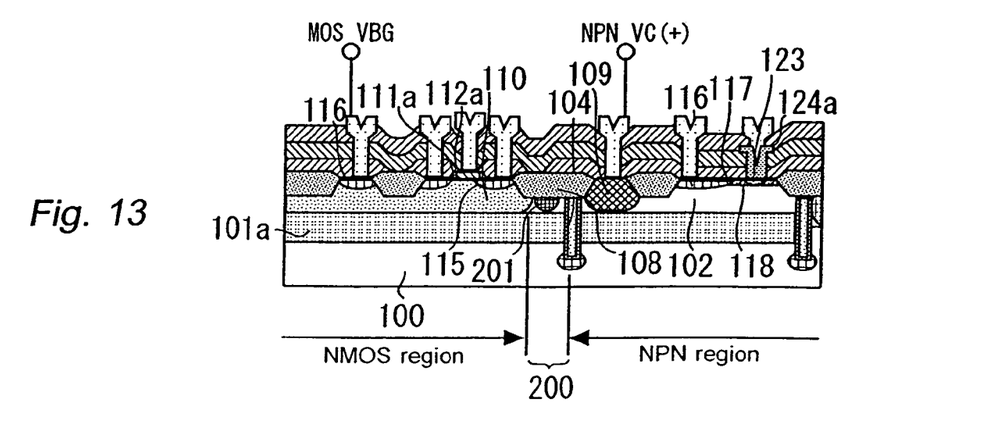
FIG. 13 is a schematic cross-sectional view of the semiconductor device as the fourth embodiment.

FIGS. 12A, 12B and 13 are schematic cross-sectional views of another BiCMOS-LSI, i.e., the semiconductor device of the fourth embodiment. FIG. 13 shows a cross-sectional structure of an area where an NPN and an NMOS region are located adjacent to each other in the fourth embodiment. FIGS. 12A and 12B illustrates a cross-section of a chip edge portion in the semiconductor device of the fourth embodiment.

With the fourth embodiment, as shown in FIG. 13, a trench 104 is formed between the NPN region and NMOS region, and an N-type tab region 201 is formed close to the trench 104. This structure provides electrical isolation between the NPN region and the NMOS region.

The N-type tab region 201 thus formed separates the trench 104 from a P-type tab region 110, creating an open-potential region 200 between the NPN region and the NMOS region. The open-potential region 200 suppresses formation of a channel across the bottoms of the trenches 104 even if a potential difference occurs between the NPN region (applied voltage: VC(+)) and the NMOS region (applied voltage: VBG), whereby leaks are minimized.

Also in the semiconductor device of the fourth embodiment, as shown in FIGS. 12A and 12B, a trench 104 is formed near the boundary between a no-element region in the chip edge portion and an element-furnished region, and an N-type tab region 201 is formed close to the trench 104. This structure creates an open-potential region 200 that electrically isolates the no-element region from the element-furnished region.

The N-type tab region 201 formed between the no-element region in the chip edge portion and the element-furnished region for electrical isolation therebetween creates the open-potential region 200. The open-potential region 200 between the two regions minimizes leaks by suppressing formation of a channel across the bottoms of the trenches 104 if a potential difference develops between the element-furnished region on the one hand and the no-element region being subject to a potential for some reason on the other hand.

Steps to manufacture the semiconductor device of the fourth embodiment are described below. Major steps constituting the method for manufacturing the fourth embodiment are substantially the same as those shown in FIGS. 1A through 7B. The description that follows will focus on some notably different steps.

In the fourth embodiment, the N-type tab region 201 is formed near the trench 104 at the boundary between the NPN region and the NMOS region prior to the formation of the element isolating oxide film 108 shown in FIG. 3A. The N-type tab region 201 is likewise formed in the chip edge portion. For tab region formation, a resist pattern covering areas other than the N-type tab region 201 is first formed by photolithography. With the resist pattern used as a mask, N-type impurities such as phosphorus ions are then implanted so as to form an impurity diffusion layer that will constitute the N-type tab region 201.

The subsequent steps are the same as those in FIGS. 3A through 7B. These steps combine to create a semiconductor device in which the N-type tab region 201 is formed near the trench 104 at the boundary between the NPN region and the NMOS region as well as at the boundary between the no-element region in the chip edge portion and the element-furnished region, whereby the open-potential region 200 is created as shown in FIGS. 12A, 12B and 13.

In the fourth embodiment, as described, the trench 104 is formed at the boundary between the NPN region and the NMOS region as well as at the boundary between the no-element region in the chip edge portion and the element-furnished region. The N-type tab region 201 is formed in the proximity of the trench 104. This provides a PN isolation structure giving rise to an open-potential region 200, whereby the regions involved are electrically separated from one another. If a potential difference occurs between the NPN region and the NMOS region or between the no-element region and the element-furnished region, any increase in potential of the polycrystalline silicon film 107a that fills the inside of the trenches 104, caused by a capacity coupling triggered by the potential difference, can be suppressed. This prevents formation of a channel across the bottoms of the trenches 104. With leaks thus stopped from the bottoms of the trenches 104, it is possible to keep the collector-to-substrate dielectric strength of the bipolar transistor from getting reduced thereby.

The semiconductor device and the method for manufacturing that device according to the invention are primarily constituted as described above and offer the following major benefits:

According to the invention, a trench is formed in a boundary area between two regions with a potential difference developing therebetween, and an open-potential region is created along the trench in the boundary area. In this structure, an increase in potential of a polysilicon film filling the trenches, caused by a capacity coupling triggered by the potential difference between the regions, can be suppressed and thereby inhibits formation of a channel across the bottoms of the trenches intended for isolation. The structure makes it possible to keep the collector-to-substrate dielectric strength of bipolar transistors from getting reduced by leaks from the trenches bottoms.

Preferably, a pair of trenches may be formed along the boundary area between two regions with a potential difference developing therebetween, and an open-potential region may be created between the paired trenches. In this structure, element-isolating trenches are formed concurrently with the open-potential region, so that the steps to manufacture the semiconductor device are simplified.

An impurity diffusion layer deep enough to reach the buried layer may formed in the proximity of trenches in the boundary region, and an open-potential region may be constituted by the impurity diffusion layer. This structure provides secure electrical isolation between the two regions and thereby enhances reliability of the semiconductor device.

Active elements including transistors may be formed in one of two adjacent regions while passive elements comprising electrical resistances or capacitors may be furnished in the other region. This structure suppresses leaks between the two regions subject to different substrate potential levels.

The buried layer may be formed in one of the two adjacent regions and in the boundary area therebetween, while no buried layer may be furnished in the other region. In the latter region, an impurity diffusion layer is formed at the same layer level as the buried layer but on a different potential level for effective region-to-region isolation.

Bipolar transistors may be formed in one of the two adjacent regions and MOS transistors may be furnished in the other region. Leaks are then inhibited between these two regions subject to different potential levels.

One of the two adjacent regions may have no elements while the other region may have elements furnished therein. Leaks are then suppressed between the no-element region and the element-furnished region.

The buried layer may be formed in the no-element region and in the boundary area while no buried layer may be provided in the element-furnished region. This structure prevents leaks if a potential difference occurs between the no-element region on the one hand and the element-furnished region with no buried layer contained therein on the other hand.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-12305, filed on Jan. 19, 2001 including specification, claims, drawings and summary, on which the Convention priority of the present application is based, are incorporated herein by reference in its entirety.

What is claimed is:

1. A semiconductor device comprising a semiconductor substrate which includes a buried layer of a predetermined conductivity type and trenches deep enough to penetrate said buried layer, wherein each of said trenches is formed in a boundary area between two regions different in electric potential, and wherein an open-potential region is created along each of said trenches in said boundary area, wherein an impurity diffusion layer which has the same conductivity type as said buried layer and which is deep enough to reach said buried layer is formed close to said trench in said boundary area, and wherein said open-potential region is constituted by said impurity diffusion layer.

2. A semiconductor device comprising a semiconductor substrate which includes a buried layer of a predetermined conductivity type and trenches deep enough to penetrate said buried layer, wherein each of said trenches is formed in a boundary area between two regions different in electric potential, and wherein an open-potential region is created along each of said trenches in said boundary area, wherein one of said two regions has no elements while the other region has elements formed therein, and wherein said buried layer is formed in the element-furnished region and in said boundary area while no buried layer is provided in the no-element region.

3. A semiconductor device comprising a semiconductor substrate which includes a buried layer of a predetermined conductivity type and trenches deep enough to penetrate said buried layer, wherein each of said trenches is formed in a boundary area between two regions different in electric potential, and wherein an open-potential region is created along each of said trenches in said boundary area, wherein an active element including a transistor is formed in one of said two regions while a passive element including either an electrical resistance or a capacitor is formed in the other region, and
wherein said buried layer is formed in said one of two regions and in said boundary area therebetween, while no buried layer is formed in said other region.

* * * * *